United States Patent [19]

Yang

[11] Patent Number: 5,825,068
[45] Date of Patent: Oct. 20, 1998

[54] INTEGRATED CIRCUITS THAT INCLUDE A BARRIER LAYER REDUCING HYDROGEN DIFFUSION INTO A POLYSILICON RESISTOR

[75] Inventor: Jeng-Jiun Yang, Sunnyvale, Calif.

[73] Assignee: Integrated Device Technology, Inc., Santa Clara, Calif.

[21] Appl. No.: 820,664

[22] Filed: Mar. 17, 1997

[51] Int. Cl.$^6$ ............................. H01L 29/76; H01L 23/58
[52] U.S. Cl. ..................... 257/380; 257/537; 257/538; 257/646; 257/751; 257/754
[58] Field of Search ................... 257/379, 380, 257/381, 536, 537, 538, 646, 751, 752, 754, 756, 758, 904

[56] References Cited

U.S. PATENT DOCUMENTS

| | | | |
|---|---|---|---|
| 4,319,953 | 3/1982 | Grabmaier | 156/608 |
| 4,923,562 | 5/1990 | Jucha et al. | 156/643 |
| 5,057,897 | 10/1991 | Nariani et al. | 257/637 |
| 5,128,279 | 7/1992 | Nariani et al. | 438/623 |
| 5,164,338 | 11/1992 | Graeger et al. | 438/50 |
| 5,290,727 | 3/1994 | Jain et al. | 438/238 |
| 5,336,335 | 8/1994 | Hall et al. | 257/51 |
| 5,349,325 | 9/1994 | McAllister | 257/536 |
| 5,374,833 | 12/1994 | Nariani et al. | 257/52 |
| 5,382,549 | 1/1995 | Ohshima et al. | 438/677 |
| 5,393,687 | 2/1995 | Liang | 438/532 |
| 5,457,335 | 10/1995 | Kuroda et al. | 257/318 |
| 5,492,865 | 2/1996 | Nariani et al. | 438/453 |

OTHER PUBLICATIONS

Hoshi, N., et al., "1.0 u$\mu$ CMOS Process for Highly Stable Tera–Ohm Polysilicon Load 1Mb SRAM", *IEEE*, International Electron Devices Meeting, Dec. 7–10, 1986 (Los Angeles), pp. 300–303.

Yoshida, S., et al., "Improvement of Endurance to Hot Carrier Degradation by Hydrogen Blocking P–Sio", *IEEE*, International Electron Devices Meeting, Dec. 11–14, 1988 (San Francisco), pp. 22–25.

Karp., J.A., et al., "A 4096–Bit Dynamic MOS RAM", *1972 ISSCC Digest*, pp. 144–145 (includes attachments from IEEE International Solid–State Circuits Conference, Feb. 19, 1969); (Pennsylvania), pp. 36–47.

Kamins, T., "Polycrystalline Silicon For Integrated Circuit Applications" (Kluwer Academic Publishers, Norwell, MA, 1988), pp. 159, 186–189, 212–215.

Wolf, S., et al., "Silicon Processing for the VLSI Era: vol. I—Process Technology" (Lattice Press, Sunset Beach, CA, 1986), pp. 177–181, 184, 191–194.

Wolf, S., "Silicon Processing for the VLSI Era: vol. II—Process Integration" (Lattice Press, Sunset Beach, CA, 1990), pp. 245–251.

Wolf, S., "Silicon Processing for the VLSI Era: vol. III—The Submicron MOSFET" (Lattice Press, Sunset Beach, CA, 1995), pp. 559–661.

*Primary Examiner*—Minh-Loan Tran
*Attorney, Agent, or Firm*—Skjerven, Morrill, MacPherson, Franklin & Friel

[57] ABSTRACT

A barrier layer impedes hydrogen diffusion into polysilicon resistors in circuits in which the resistor resistivity is sensitive to hydrogen diffusion into the resistors. The barrier layer extends laterally throughout the whole integrated circuit except for contact areas in which circuit elements overlying the barrier layer contact conductive elements underlying the barrier layer. The barrier layer includes a layer of polysilicon or amorphous silicon. In some embodiments, the barrier layer includes multiple layers of polysilicon or amorphous silicon that are separated by thin layers of silicon dioxide. In some embodiments, the barrier layer is formed between the polysilicon resistor and PECVD silicon nitride passivation which contains atomic hydrogen.

14 Claims, 4 Drawing Sheets

INTEGRATED CIRCUITS THAT INCLUDE A BARRIER LAYER REDUCING HYDROGEN DIFFUSION INTO A POLYSILICON RESISTOR

BACKGROUND OF THE INVENTION

The present invention relates to integrated circuits including polysilicon resistors, and more particularly to reducing hydrogen diffusion into the polysilicon resistors whose resistivity is sensitive to hydrogen diffusing into the resistors.

Polysilicon resistors are widely used in integrated circuits. For example, polysilicon resistors are used as load resistors in static random access memory cells (SRAM cells). The resistance of a polysilicon resistor can be undesirably affected by hydrogen diffusing into the resistor from an overlying plasma-deposited silicon nitride passivation layer. See, for example, N. Hoshi et al., "1.0 $\mu$m CMOS Process for Highly Stable Tera-Ohm Polysilicon Load 1 MB SRAM", Tech. Dig. IEDM, 1986, pages 300–303. Hoshi et al. reduce hydrogen diffusion into the resistor by sandwiching the resistor between LPCVD silicon nitride films formed on top and below the resistor (LPCVD stands for low pressure chemical vapor deposition).

It is desirable to find other techniques for reducing hydrogen diffusion into a polysilicon resistor.

SUMMARY

Silicon nitride is widely used as a passivation layer in integrated circuits because it is a good barrier to diffusion of moisture and sodium into the circuit and because of some other advantages. See S. Wolf et al., "Silicon Processing for the VLSI Era; Volume 1—Process Technology", pages 191–194 incorporated herein by reference. Silicon nitride passivation is typically formed by PECVD (plasma enhanced chemical vapor deposition) because PECVD allows the silicon nitride to be deposited at a fairly low temperature (300°–400° C.). The low temperature is desirable because it will not melt such low-melting-point metals as aluminum and because, therefore, aluminum and its alloys can be used in the integrated circuit for interconnect fabrication. However, the PECVD silicon nitride contains substantial quantities of atomic hydrogen. Hydrogen gets into the silicon nitride because hydrogen is present in the reagents from which the silicon nitride is deposited. Hydrogen can also be introduced by processing steps other than the silicon nitride deposition, and in particular by plasma-enhanced processing steps. For example, hydrogen can be introduced by CVD (e.g., PECVD) of silane based or TEOS based silicon dioxide. See S. Wolf et al., "Silicon Processing for the VLSI Era; Volume 1—Process Technology", page 184 incorporated herein by reference. Hydrogen can reach the resistor during such processing steps. Alternatively, hydrogen can get into some other layer during such processing steps, and can diffuse into the resistor later, for example during subsequent processing at elevated temperatures. When hydrogen gets into the polysilicon resistor, hydrogen changes the resistor resistance (the resistance may increase or decrease depending on the resistor doping level). Since it may be difficult to control the amount of hydrogen diffusion, the resistance may be difficult to control. Further, if same stages of the integrated circuit fabrication process become redesigned (for example, to improve yield or planarization), the amount of hydrogen reaching the polysilicon resistor can change. Therefore, other changes may have to be introduced to obtain a desired resistance value (for example, the resistor thickness or doping level may have to be changed).

The amount of hydrogen in the silicon nitride can be reduced by depositing the nitride by LPCVD at higher temperatures (700°–800° C.). However, the high temperatures make the LPCVD silicon nitride less suitable for integrated circuit fabrication. Another disadvantage of the LPCVD silicon nitride is its higher tensile stresses.

According to the present invention hydrogen diffusion into the polysilicon resistors is reduced by a barrier layer. The barrier layer covers not only the polysilicon resistors but extends laterally throughout the whole integrated circuit. The barrier layer is interrupted only in contact areas where circuit elements overlying the barrier layer contact circuit elements underlying the barrier layer. Consequently, the barrier layer impedes not only downward diffusion of hydrogen from areas directly overlying the polysilicon resistors, but also downward and lateral diffusion from areas laterally spaced from the resistors.

In some embodiments, the barrier layer includes one or more layers of polysilicon and/or amorphous silicon. Polysilicon or amorphous silicon layers present in the barrier layer are suitable for reducing hydrogen diffusion because such layers have dangling bonds that can trap hydrogen. In polysilicon, the dangling bonds are provided by silicon atoms on the polysilicon grain boundaries (crystal boundaries). In amorphous silicon, the dangling bonds are provided by many silicon atoms throughout the amorphous silicon film.

To increase the number of dangling bonds in polysilicon, it is desirable to reduce the polysilicon grain size. Similarly, with amorphous silicon, it is desirable to reduce the size of the grains that can be formed in the amorphous silicon during any high temperature processing that may take place after the amorphous silicon deposition.

In order to increase the number of dangling bonds, in some embodiments the barrier layer includes multiple layers of polysilicon or amorphous silicon that are separated by thin layers of silicon dioxide. Silicon dioxide is an amorphous material, and silicon grains do not extend across the silicon dioxide. Consequently, the silicon grain vertical dimension is reduced. Of note, some polysilicon deposition techniques produce silicon grains that extend vertically (have columnar structure). See S. Wolf, et al., "Silicon Processing for the VLSI Era; Volume 1—Process Technology" (1986), pp. 179–180. The silicon dioxide limits the vertical extent of these columnar grains.

Contacts between circuit elements overlying the barrier layer and circuit elements underlying the barrier layer pass through the barrier layer but are insulated from the barrier layer. In some embodiments, the insulation is provided as follows. Openings are etched in the barrier layer before the deposition of overlying dielectric. Then the dielectric are deposited, and contact openings are etched in the dielectric. These contact openings pass through the openings that were etched in the barrier layer. However, these contact openings are smaller in size than the corresponding openings in the barrier layer. The barrier layer is not exposed by the contact openings and is insulated from the contacts.

The barrier layer does not provide any circuit elements but is insulated from the circuit elements.

The barrier layer is suitable in circuits in which the resistivity of the polysilicon resistors is sensitive to hydrogen diffusion into the resistors.

Other features and advantages of the invention are described below. The invention is defined by the appended claims.

DESCRIPTION OF PREFERRED EMBODIMENTS

Figure 1:
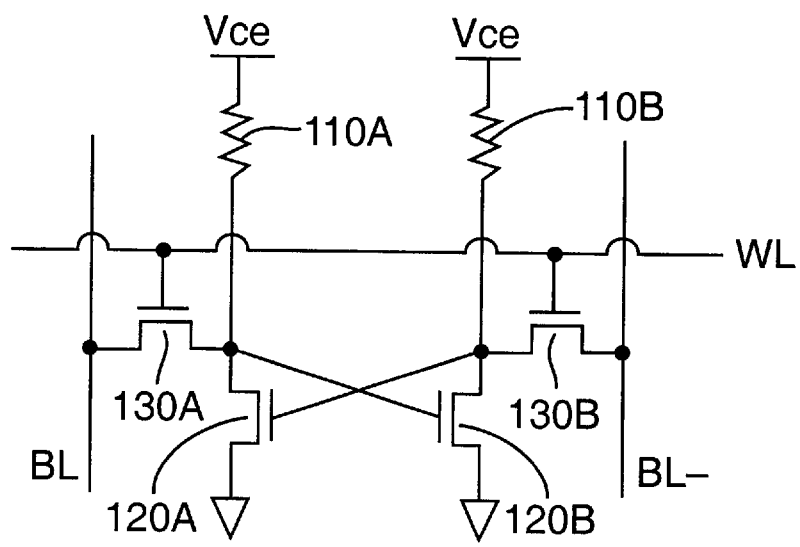
FIG. 1 is a circuit diagram of a four transistor SRAM cell whose load resistors can be fabricated in accordance with the present invention.

FIG. 1 is a well-known circuit diagram of a four transistor static random access memory cell ("SRAM" cell). The cell includes load resistors 110A, 110B. One terminal of each resistor 110 is connected to a power supply voltage VCC. The other terminal of resistor 110A is connected to the drain of pull-down NMOS transistor 120A. The other terminal of resistor 110B is connected to the drain of pull-down NMOS transistor 120B. The sources of transistors 120A, 120B are connected to a reference voltage (for example, ground). The drain of transistor 120A is connected to the gate of transistor 120B and to a source/drain terminal of NMOS pass transistor 130A. The other source/drain terminal of transistor 130A is connected to bit line BL. The drain of transistor 120B is connected to the gate of transistor 120A and to a source/drain terminal of NMOS pass transistor 130B. The other source/drain terminal of transistor 130B is connected to a complementary bit line BL-. The gates of pass transistors 130A, 130B are connected to a word line WL.

Figure 2:
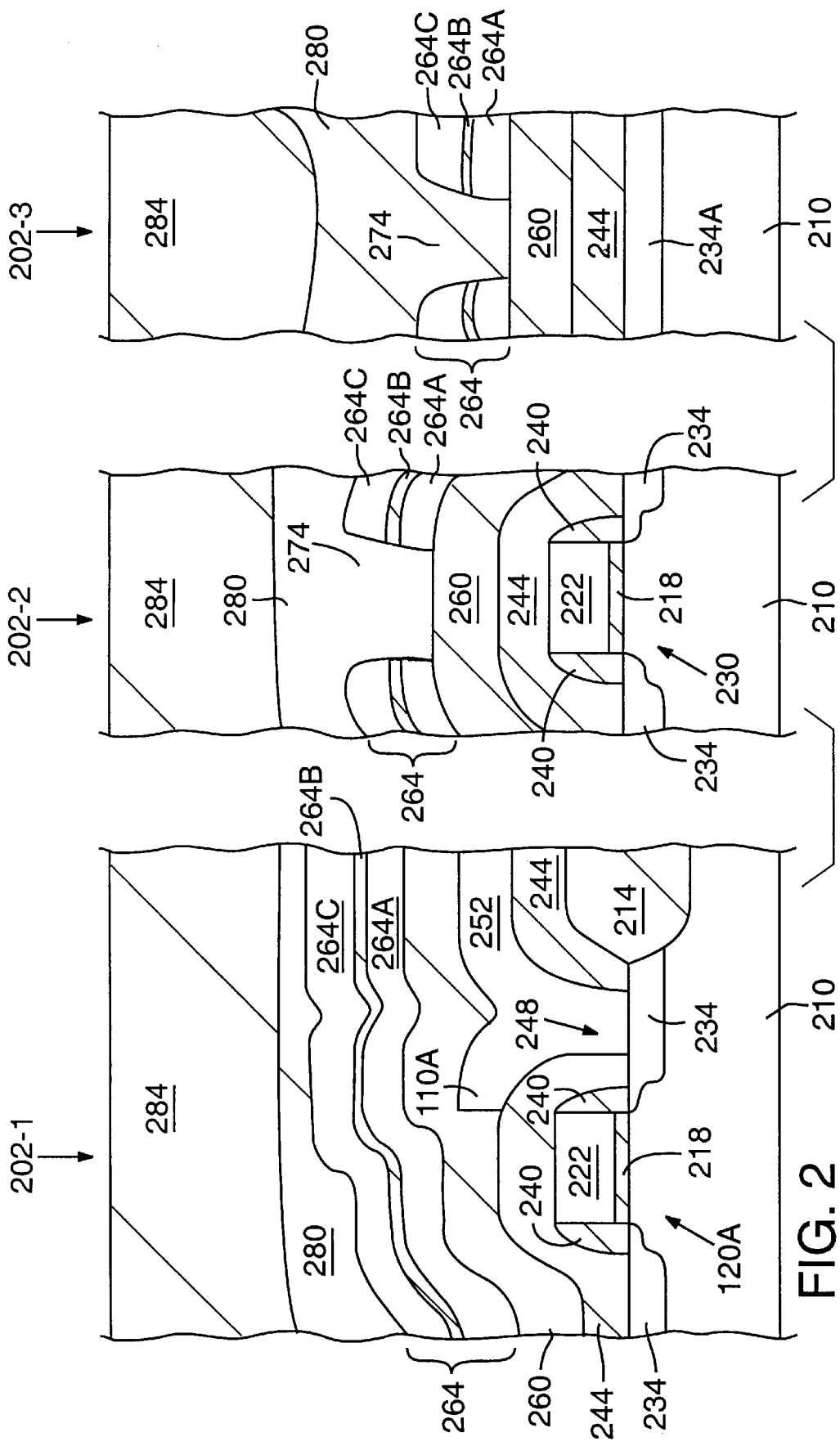
FIGS. 2–4 are cross section illustrations of an integrated circuit according to the present invention at different stages of fabrication.

FIG. 2 illustrates beginning stages of the fabrication of an integrated circuit that includes the SRAM cell of FIG. 1. In some embodiments, the integrated circuit is a CMOS circuit. FIG. 2 illustrates three integrated circuit cross-sections 202-1, 202-2, 202-3. These cross-sections may or may not lie in the same plane.

Fabrication begins with a monocrystalline silicon substrate 210. Substrate 210 is suitably doped and, perhaps, includes N or P well regions (not shown). Field oxide regions 214 and/or other isolation regions are formed over and/or in the substrate using known isolation techniques. Gate insulation 218 is formed from silicon dioxide and/or other insulating materials, as known in the art. In some embodiments, after the gate dielectric formation, an anneal is performed to improve the gate dielectric quality. Heavily doped polysilicon layer 222 is deposited and patterned to form the gates of transistors 120A, 120B, 130A, 130B, and other transistors. FIG. 2 shows transistor 120A and another transistor 230. In some embodiments, polysilicon layer 222 also provides word line WL and interconnect lines.

In some embodiments, conductive layer 222 includes a metal silicide layer (for example, a tungsten silicide layer) on top of a heavily doped polysilicon layer. The polysilicon layer and the metal silicide layer are patterned using the same mask.

Dopants are implanted into substrate 210 to form transistor source/drain regions 234 and other doped regions such as region 234A. Region 234A is used as a transistor region, or as a conductive line, or for some other purpose. This region is shown in FIG. 2 to illustrate formation of contacts to doped regions from overlying metal layers (the metal layers are not shown in FIG. 2).

A conformal dielectric layer 240 (silicon dioxide or silicon nitride in some embodiments) is deposited and etched anisotropically to form spacers on transistor gate sidewalls. Then one or more dopant implantation steps form well-known LDD (lightly doped drain) structures for the MOS transistors and reduce the resistivity of the conductive lines.

In some embodiments, the exposed top surfaces of polysilicon layer 222 and doped regions 234, 234A are silicided using, for example, well known salicide techniques.

Silicon dioxide 244 is deposited by a known CVD (chemical vapor deposition) process. In some embodiments, this process is PECVD followed by a high temperature thermal cycle to densify the oxide. Layer 244 is patterned lithographically to form contact openings such as opening 248 to the drain 234 of transistor 120A. A polysilicon layer 252 is deposited and patterned to form load resistors 110A, 110B and also to form interconnects. FIG. 2 shows only a portion of resistor 110A and does not show resistor 110B or interconnects. Resistor 110A contacts the drain of transistor 120A through opening 248.

In some embodiments, polysilicon 252 is deposited by CVD to a thickness of 100–200 nm. The interconnect portions of layer 252 are heavily doped. Resistor portions of layer 252 are undoped or lightly doped. In some embodiments, the resistance of each resistor 110A, 110B after the integrated circuit has been fabricated is between 10 GΩ and several hundred gigaohm, between 10 and 200 GΩ in some embodiments.

Undoped silicon dioxide 260 is deposited over polysilicon 252 by PECVD at 380°–400° C. from silane and oxygen to a thickness of about 150–200 nm.

Oxide 260 deposition can produce hydrogen. In some embodiments, some steps preceding the fabrication of layer 252 resistors are plasma-enhanced steps also producing hydrogen which can later diffuse into the resistors. Hence the resistance of polysilicon resistors made from layer 252 is adjusted accordingly. However, the barrier layer 264 deposited next will reduce diffusion into the resistors of hydrogen present in overlying layers or produced in subsequent processing steps. Of note, in some embodiments, some low temperature processing steps following the deposition of the metal 1 layer (not shown in FIG. 2) overlying the barrier layer 264 are plasma-enhanced steps producing significant amounts of hydrogen. Because of layer 264, if the processing steps following the deposition of barrier layer 264 become redesigned, the amount of hydrogen reaching the layer 252 resistors will not change significantly in some embodiments.

Barrier layer 264 extends laterally throughout the whole integrated circuit except for contact areas in which an overlying conductive layer or layers will contact polysilicon 222 or diffusion regions 234, 234A. Layer 264 contains dangling bonds that will trap hydrogen.

Layer 264 contains one or more layers of polysilicon or amorphous silicon. To increase the number of dangling bonds, in some embodiments polysilicon is deposited so as to reduce the vertical (columnar) size of the silicon grains. Of note, some deposition processes produce silicon grains extending vertically to form "columnar structure". See U.S. Pat. No. 5,393,687 issued Feb. 28, 1995 to Liang and incorporated herein by reference. See also S. Wolf et al., "Silicon Processing for the VLSI Era; Volume 1—Process Technology" (1986), pp. 177–181 incorporated herein by reference. To reduce the vertical size of the grains, barrier layer 264 is made up of several polysilicon layers separated by thin silicon dioxide layers. This technique is also useful when the layer 264 includes amorphous silicon because high temperature processing present after amorphous silicon deposition may convert the amorphous silicon to polysilicon.

In some embodiments, barrier layer 264 is formed as follows. Polysilicon or amorphous silicon layer 264A is deposited to a thickness of about 50–100 nm. In some embodiments, layer 264A is polysilicon deposited in a furnace by LPCVD from silane at about 620°–630° C. In other embodiments, layer 264A is amorphous silicon deposited in a furnace by LPCVD from silane at about 530°–560° C. Other polysilicon or amorphous silicon deposition techniques are used in other embodiments.

Then layer 264A is exposed to a small amount of oxygen inside the deposition chamber for about 15–30 minutes at the same temperature as was used for layer 264A deposition (e.g. 620°–630° C. for polysilicon, 530°–560° C. for amorphous silicon). As a result, a thin layer 264B of silicon dioxide is formed on the top surface of layer 264A. Then another 50–100 nm layer 264C of polysilicon or amorphous silicon is deposited by any of the processes described above for layer 264A. Even if layers 264A, 264C are polysilicon layers having columnar grain structure, the columnar grain structure is broken by oxide 264B.

In some embodiments, additional layers of silicon dioxide and polycrystalline or amorphous silicon are fabricated as part of layer 264. In some embodiments, the total thickness of barrier layer 264 is 250–400 nm.

In some embodiments, barrier layer 264 is a single layer of polycrystalline or amorphous silicon having a thickness of 250–400 nm. The polysilicon or amorphous silicon is deposited as described above for layer 264A. Alternatively layer 264 is amorphous silicon deposited by a PVD (physical vapor deposition) sputtering method at about room temperature.

Barrier layer 264 is masked by a resist and plasma etched to form contact holes 274 in the areas in which overlying layers will contact polysilicon 222 or doped regions 234, 234A. The etch uses known chlorine-based chemistry. In some embodiments, known fluorine-based chemistry is used to etch the oxide 264B and other oxide layers, if present, in layer 264. The etch stops on dielectric layer 260.

Undoped silicon dioxide 280 is TEOS-based oxide deposited by PECVD to a thickness of about 800 nm. Oxide 280 is partially planarized using a known photoresist/etch-back planarization technique. More particularly, photoresist (not shown) is spun on layer 280, and the photoresist and the layer 280 are etched by an etch adjusted for equal photoresist and oxide etch rates. The etch terminates when all the photoresist is etched away and a desired thickness is achieved for layer 280. After this partial planarization of layer 280, a BPSG (borophosphosilicate glass) layer 284 is deposited, annealed, and planarized by chemical-mechanical polishing.

Figure 3:
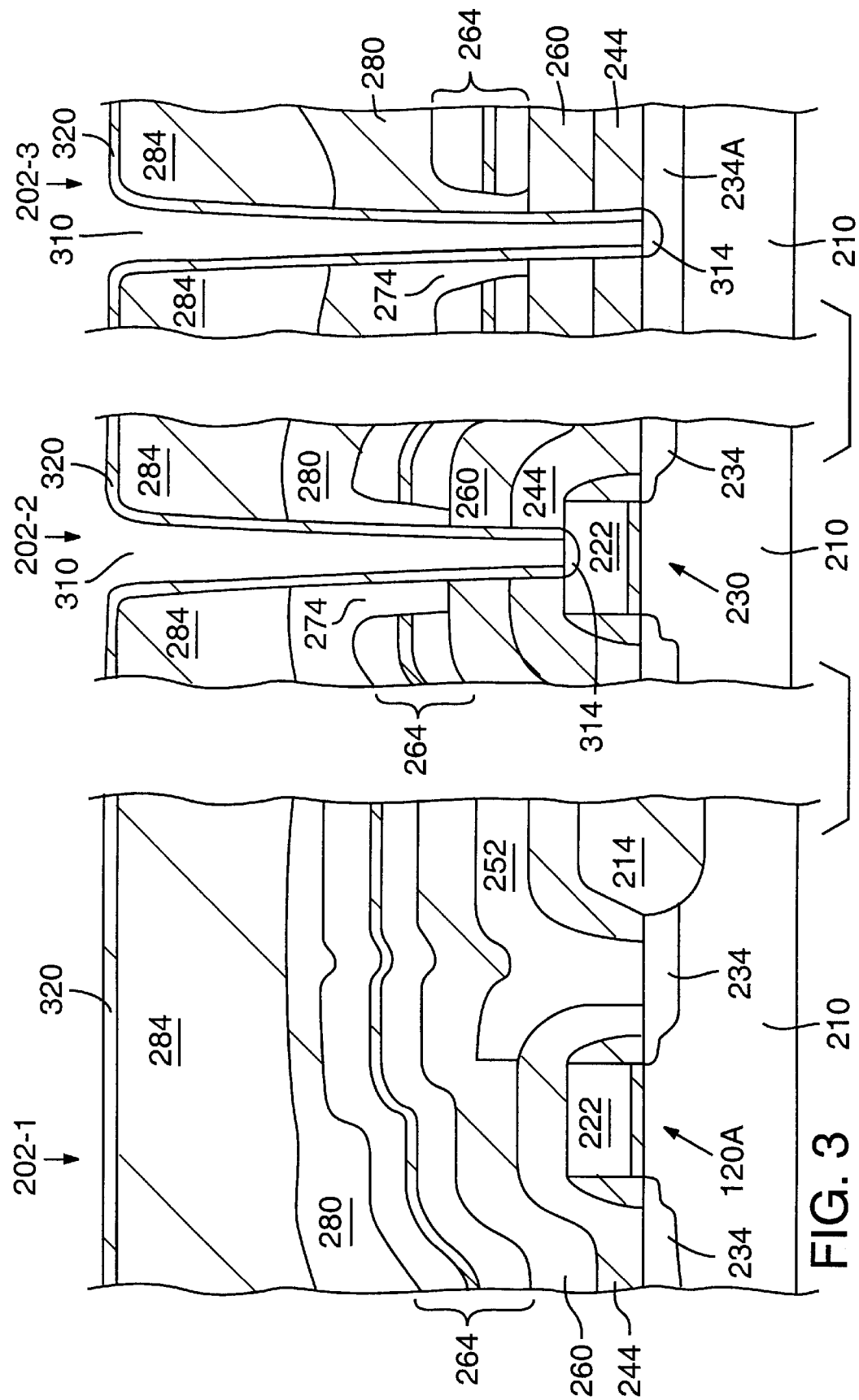

Resist (not shown) is spun on layer 284. The resist is patterned using a metal I contact mask. Dielectric layers 284, 280, 260, and 244 are etched through the mask openings in the resist to form contact openings 310 (FIG. 3) that expose polysilicon 222 and doped regions 234 such as region 234A. Each contact opening 310 passes inside a corresponding opening 274 in barrier layer 264. Therefore, the sidewalls of openings 310 are insulated from layer 264 by dielectric 280.

In some embodiments, the mask design (mask specification) for each opening 274 essentially duplicates the mask design for a corresponding opening 310, except that the mask design for each opening 274 is made larger (by about 0.2–0.25 μm per side in some embodiments) than the mask design for the corresponding opening 310 (the mask design for each opening 310 is a square having a side length of 0.5–0.8 μm in some embodiments). This mask design rule simplifies the mask design for openings 274 and hence simplifies adding a barrier layer 264 to an existing process.

Then P+ and N+ contact implants are performed at 0 degree tilt to form respectively P+ and N+ heavily doped regions 314 in polysilicon 222, in doped region 234A, and in other exposed doped regions (not shown). Heavily doped regions 314 will reduce the contact resistance for the metal I contacts. The zero degree tilt used for the implants makes it more difficult for the dopants to get into oxide 280 in the area of openings 274 and into barrier layer 264. The zero degree tilt prevents implant damage to oxide 280 in the area of openings 274 and also prevents the dopant from getting into barrier layer 264. This allows preserving good insulation between metal contacts in openings 310.

A thin silicon dioxide layer 320 (10 nm in some embodiments) is deposited by PECVD at about 380°–400° C. PECVD enables the use of the low deposition temperature. Rapid thermal anneal (RTA) at 950°–1,000° C. activates the dopants in regions 314 and, possibly, in other doped regions. Oxide 320 prevents the dopants from evaporating from the regions 314 during the RTA.

Figure 4:
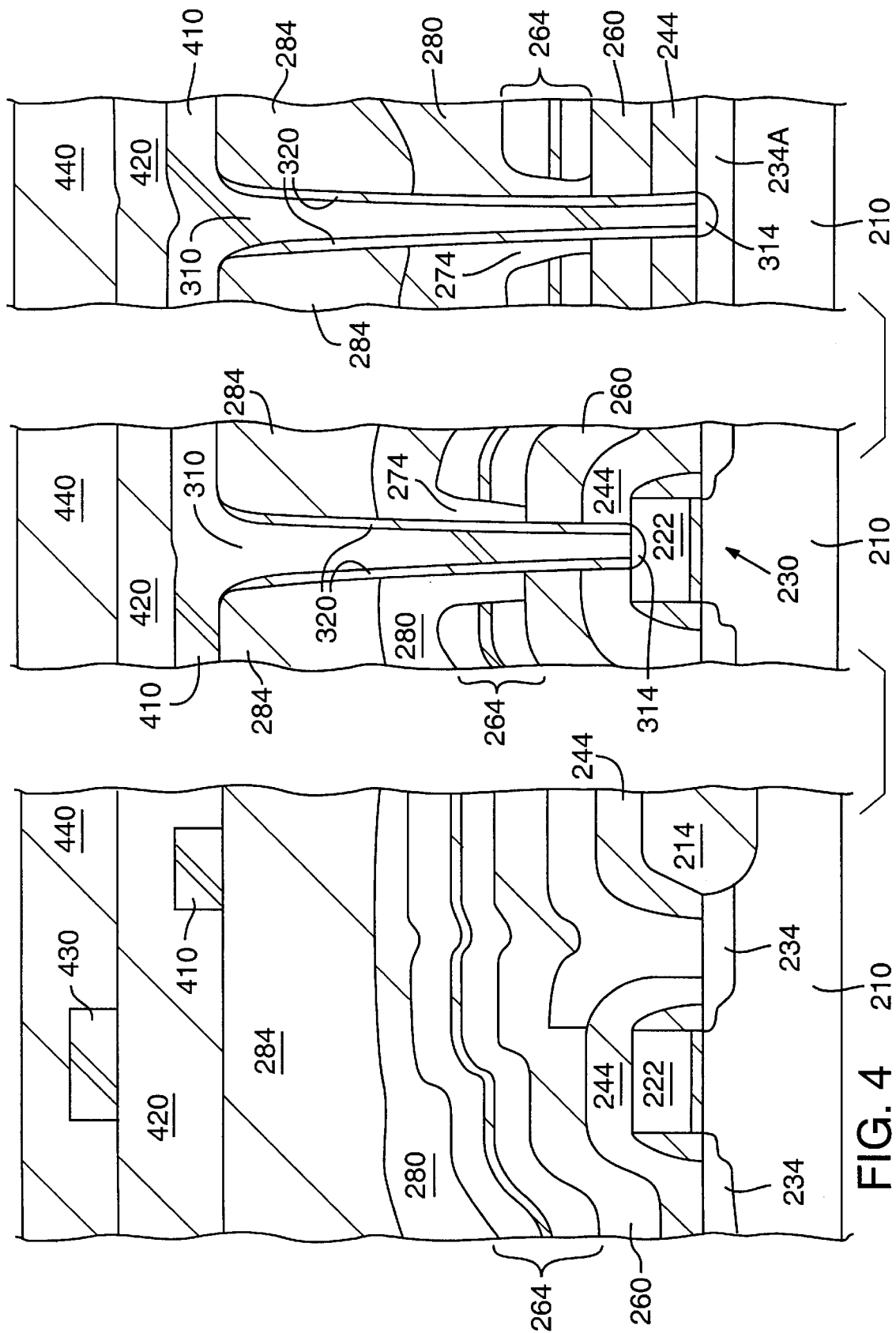

A dry plasma etch of oxide 320 removes the oxide from the bottom of openings 310. The etch is sufficiently soft to keep the damage to the silicon lattice in layers 222, 234, 234A down to acceptable levels. At the same time, the etch is sufficiently anisotropic not to remove oxide 280 on the sidewalls of openings 310. In some embodiments, the etch also leaves portions of oxide 320 on the sidewalls of openings 310. The etch removes oxide 320 from the top surface of BPSG 284. The remaining portions of oxide 320, if any, on the sidewalls of openings 310 will help insulate the barrier layer 264 from the metal I layer 410 (FIG. 4).

Deposition of metal 410 is started within a short time (two hours in some embodiments) after the etch of oxide 320 to prevent native oxide formation on the exposed areas of polysilicon 222 and doped regions 234, 234A. In some embodiments, metal layer 410 is formed as follows. 30 nm of titanium and 120 nm of TiN are deposited over the structure and annealed by an RTA process. Then tungsten is deposited by CVD at 475° C. to fill the contact openings 310. In some embodiments, the tungsten thickness is 700–900 nm. The tungsten is removed over oxide 284 by a blanket etch. The tungsten plugs filling the openings 310 remain. The tungsten plugs and the Ti and TiN layers are insulated from barrier layer 264 by oxide 280 and possibly by oxide 320.

Then Al—Si—Cu is deposited to a thickness of 420 nm. Then TiW is deposited to a thickness of 80 nm. This completes the first metal 410 deposition.

Tungsten deposition is described, for example, in S. Wolf, "Silicon Processing for the VLSI Era; Volume 2 —Process Integration" (1990), pages 245–251 incorporated herein by reference.

First metal 410 is patterned by known techniques.

Silicon dioxide layer 420 (FIG. 4) is deposited and patterned using standard techniques. In some embodiments, oxide 420 deposition involves: (1) depositing a silicon dioxide layer; (2) spinning photoresist on the silicon dioxide and achieving a planar photoresist surface; (3) blanket etch of the resist and the silicon dioxide at equal etch rates until the resist is etched off; and (4) deposition of another silicon dioxide layer. Oxide 420 has a planar top surface. Metal II layer 430 (aluminum or aluminum-containing alloy in some embodiments) is deposited and patterned to form interconnect lines.

Dielectric layer 440 is deposited and patterned over the metal 430 using known techniques. Layer 440 includes a silicon dioxide layer and an overlying silicon nitride passivation layer. In some embodiments, the silicon nitride is deposited by PECVD by reacting silane with ammonia or nitrogen. See, for example, S. Wolf et al., "Silicon Processing for the VLSI Era; Volume 1—Process Technology" (1986), pages 193–194 incorporated herein by reference.

A furnace anneal of about 420° C. completes the integrated circuit fabrication. Barrier layer 264 reduces hydrogen diffusion into the polysilicon resistors during this anneal.

Barrier layer 264 extends laterally throughout the whole integrated circuit except for the contact areas between overlying and underlying circuit elements and reduces the hydrogen diffusion into polysilicon resistors 110. Barrier layer 264 is not connected to any circuit elements and does not form part of any circuit.

In some embodiments, barrier layer 264 improves hot carrier reliability of the integrated circuit by trapping undesirable charges and/or hydrogen. The hot carrier reliability problem and charge trapping are described in U.S. Pat. No. 5,290,727 issued Mar. 1, 1994 to Jain et al. and incorporated herein by reference. See also S. Wolf, "Silicon Processing for the VLSI Era; Volume 3—The Submicron MOSFET" (1995), pages 559–661 incorporated herein by reference; S. Yoshida et al., "Improvement of Endurance to Hot Carrier Degradation by Hydrogen Blocking P—SiO", IEDM Technical Digest (1988), pp. 22–25 incorporated herein by reference. Some electrical properties of polysilicon are described in T. Kamins, "Polycrystalline Silicon for Integrated Circuit Applications" (1988), pages 159, 186–189 and 212–215 incorporated herein by reference.

The embodiments described above illustrate but do not limit the invention. The invention is not limited by dimensions or composition of any particular layer. In some embodiments, materials other than silicon dioxide are used in the barrier layer to limit the silicon grain size. In some embodiments, such materials do not have a crystal structure of silicon. Some embodiments include non-metal conductive layers above and/or below the barrier layer. In some embodiments, the integrated circuit contains more than two conductive layers overlying the barrier layer 264. In some embodiments, additional conductive layers underlie the barrier layer 264. In some embodiments, contacts between the conductive layers overlying the barrier layer 264 and the conductive layers underlying the layer 264 are formed similarly to the contacts described above in connection with FIGS. 2–4. In some embodiments, silicon oxide or silicon nitride are replaced by other dielectric materials. Some embodiments include polysilicon resistors made from different polysilicon layers in the same integrated circuit. Some embodiments include multiple barrier layers in the same integrated circuit. In some embodiments, a barrier layer is provided under a polysilicon resistor. The invention is not limited to CMOS circuits or circuits containing SRAM cells. Other embodiments and variations are within the scope of the invention, as defined by the appended claims.

I claim:
1. An integrated circuit comprising:

a polysilicon resistor;

a barrier layer for reducing hydrogen diffusion into the polysilicon resistor, the barrier layer comprising at least two polysilicon and/or amorphous silicon layers, each layer separated from an adjacent layer by a non-silicon layer, wherein said barrier layer has a thickness of less than approximately 400 nanometers;

one or more circuit elements under the barrier layer; and one or more circuit elements over the barrier layer which contact one or more circuit elements under the barrier layer, wherein the barrier layer extends laterally throughout the whole integrated circuit except for one or more contact areas in which one or more circuit elements over the barrier layer contact one or more circuit elements under the barrier layer.

2. The integrated circuit of claim 1 wherein the non-silicon layers do not have the crystal structure of silicon.

3. The integrated circuit of claim 2 wherein the non-silicon layers comprise silicon oxide.

4. The integrated circuit of claim 1 wherein the barrier layer comprises polysilicon.

5. The integrated circuit of claim 1 wherein the barrier layer comprises amorphous silicon.

6. The integrated circuit of claim 1 further comprising a dielectric layer overlying the polysilicon resistor and underlying the barrier layer.

7. The integrated circuit of claim 1 wherein the barrier layer is not connected to any circuit.

8. The integrated circuit of claim 1 wherein the polysilicon resistor is a load resistor in a four-transistor SRAM cell.

9. An integrated circuit comprising a barrier layer having a plurality of polysilicon and/or amorphous silicon layers, each polysilicon and/or amorphous silicon layer separated from an adjacent polysilicon and/or amorphous silicon layer by a non-silicon layer, wherein said barrier layer has a thickness of less than approximately 400 nanometers.

10. The integrated circuit of claim 9, wherein the non-silicon layer comprises silicon oxide.

11. The integrated circuit of claim 10, wherein the silicon oxide is a thermally grown silicon oxide.

12. The integrated circuit of claim 9 further comprising a polysilicon resistor structure, wherein said barrier layer overlies said resistor structure.

13. The integrated circuit of claim 12, wherein said resistor structure is a load resistor in a four-transistor SRAM cell.

14. The integrated circuit of claim 12 further comprising a dielectric layer interposed between said resistor structure and said barrier layer.

* * * * *